BIDIRECTIONAL R.F. AMPLIFIER

Filed May 15, 1968

INVENTOR.
NATHAN FREEDMAN
BY
Willard R. Matthews Jr.
ATTORNEY

United States Patent Office
3,514,551
Patented May 26, 1970

3,514,551

BIDIRECTIONAL R.F. AMPLIFIER

Nathan Freedman, West Newton, Mass., assignor to the United States of America as represented by the Secretary of the Air Force Filed May 15, 1968, Ser. No. 729,327
Int. Cl. H04b *3/38;* H03f *3/12*
U.S. Cl. 179—170 1 Claim

ABSTRACT OF THE DISCLOSURE

Negative resistance devices are arranged with resistance means in $\tau$ and $\pi$ configurations to provide bidirectional R.F. signal amplification. The invention is primarily directed toward the utilization of Esaki or tunnel diodes. A particular relationship between values of the resistance means and negative resistances of the negative resistance devices provides matched input and output conditions and minimizes the number of diodes required.

BACKGROUND OF THE INVENTION

This invention relates to R.F. amplifiers and in particular to amplifiers utilizing negative resistance devices.

The phenomena of A.C. negative resistance has been utilized in electronic circuits to provide amplification and oscillation for many years. Thyratrons and gas filled triodes are typical of the negative resistance devices originally used in these applications. The invention of the tunnel diode in 1958 by Leo Esaki greatly stimulated interest in the use of negative resistance device amplifiers and oscillators. The tunnel diode is a two-terminal semiconductor device that displays an A.C. negative resistance over a portion of its current-voltage curve when the diode is biased in the forward direction. Such a diode is capable of nanosecond switching speeds, operates effectively at microwave frequencies over wide temperature ranges and has characteristics that are relatively unchanged by moisture and atmospheric gasses. These characteristics together with low operating power requirements make it a very attractive amplifier device. Consequently, the prior art reflects many amplifier circuits utilizing tunnel diodes. These circuits in general provide unidirectional amplification and consist of single or cascade diodes arranged in series or in parallel with the load. The state-of-the-art with regard to such tunnel diode circuits is recorded in detail in the text Basic Theory and Application of Tunnel Diodes, Sylvester P. Gentile, published by D. Van Nostrand Company, Inc., 1962.

The prior art negative resistance device amplifier circuits are adequate in the majority of cases. There are, however, various applications that require bidirectional amplification and others that call for minimizing the number of diodes to be used. Prior art circuits have been something less than satisfactory in these instances. A particular example of such an application is disclosed in my co-pending patent application Ser. No. 729,329 entitled: Radar Beacon System With Transponder For Producing Amplified, Phase Shifted Retrodirected Signals, filed on even date herewith. There is disclosed therein an airborne radar transponder having a balanced antenna array wherethrough received and transmitted signals are passed in both directions. The requirements in this instance are for low power bidirectional amplification, using a minimum number of inexpensive lightweight components. The novel circuits disclosed herein overcome the inadequacies of prior art devices in meeting these and other requirements.

SUMMARY OF THE INVENTION

The present invention utilizes negative resistance devices in unique circuit configurations to achieve these objectives. Two particular circuits are comprehended which provide bidirectional R.F. signal amplification and balanced input and output conditions. One preferred embodiment, a $\tau$ circuit configuration, includes two negative resistance devices connected in series between two input-output terminals and a resistor connected between the junction of the negative resistance devices and ground. Performance of the amplifier is optimized by a specific relationship between the negative resistance values of the negative resistance devices and the resistance of the resistor. This relationship is determined by the equation.

$$R=\frac{A^{-2}-1}{2\overline{A}}$$

where R is the resistance of the resistor, A is the negative resistance value of a negative resistance device, and $\overline{A}$ is the negative of the resistance value of each negative resistance device. It is preferred that tunnel diodes be used as the negative resistance devices in this circuit. By way of example, a specific circuit is disclosed which includes tunnel diodes, means for biasing the diodes in a forward direction, and D.C. isolating capacitors located between the $\tau$ components and external circuits.

An alternative, preferred embodiment of the invention, a $\pi$ circuit configuration, comprehends a resistor connected between input-output terminals and a negative resistance device connected between each end of the resistor and ground. Tunnel diodes and means for biasing them, together with isolating capacitors, are also included in the complete circuit for the amplifier. The relationship between resistor value and negative resistance values of the negative resistance devices is determined by reference to the $\tau$ circuit embodiment using the relationships $$A_{(\pi\ \text{circuit})}=A_{(\tau\ \text{circuit})}+2R_{(\tau\ \text{circuit})}$$

and $$R_{(\pi\ \text{circuit})}=2A_{(\tau\ \text{circuit})}+\frac{A^2{}_{(\tau\ \text{circuit})}}{R_{(\tau\ \text{circuit})}}$$

It is a principal object of this invention to provide a negative resistance device amplifier that is capable of bidirectional amplification of signal applied to either terminal thereof.

It is another object of this invention to provide a bidirectional R.F. amplifier having low power requirements.

It is another object of this invention to provide a light weight, inexpensive bidirectional R.F. amplifier.

It is another object of this invention to provide a bidirectional R.F. amplifier utilizing tunnel diodes.

It is another object of this invention to provide a negative resistance element bidirectional R.F. amplifier that requires a minimum number of diodes for a given amount of amplification.

It is another object of this invention to provide a bidirectional R.F. amplifier comprising a $\tau$ circuit arrangement of tunnel diodes and a resistor.

It is another object of this invention to provide a bidirectional R.F. amplifier comprising a $\pi$ circuit arrangement of tunnel diodes and a resistor.

It is another object of this invention to provide a bidirectional R.F. amplifier of the type described wherein the tunnel diodes and resistors have discrete relationships effective to provide matched input and output conditions.

These, together with other objects, advantages and features of the invention, will become more apparent from the following detailed description when taken in conjunction with the illustrative embodiments in the accompanying drawings.

DESCRIPTION OF THE PREFERRED EMBODIMENTS

One central concept of the present invention is the use of negative resistance devices to provide R.F. signal amplification. Because of the various desirable characteristics of tunnel diodes recited above, they are the preferred negative resistance devices used in the circuits described herein. It is to be understood , however, that the principles of the invention apply to negative resistance values and not necessarily to tunnel diodes. Therefore, any device that exhibits this negative resistance effect can be used and such devices together with appropriate circuitry and associated components are intended to fall within the scope of the invention.

Figures 1, 2:
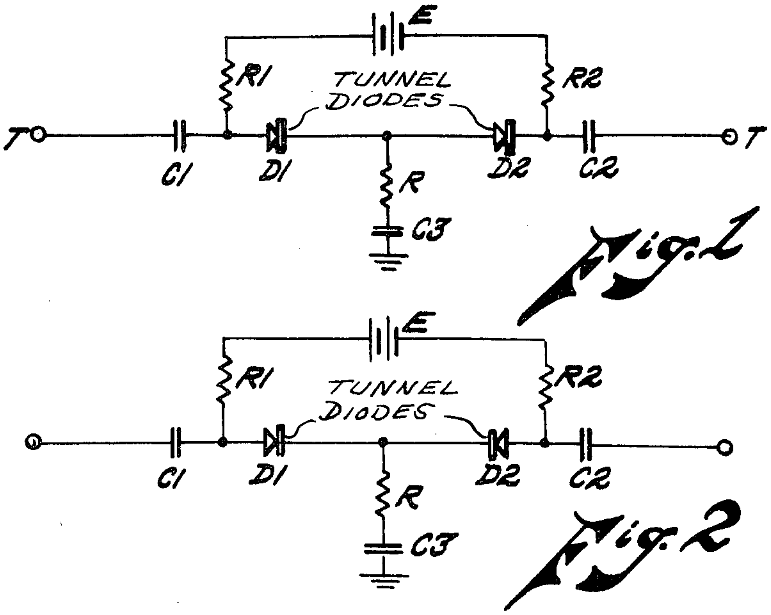
FIG. 1 is a schematic diagram of the preferred embodiment of the invention employing a $\tau$ circuit configuration.
FIG. 2 is a schematic diagram of the embodiment of FIG. 1 illustrating alternative diode orientation.

Referring now to FIGS. 1 and 2, there are disclosed thereby schematic diagrams of the embodiment of the invention which utilizes the $\tau$ circuit configuration. Tunnel diodes D1 and D2 are connected in series relationship between input-output terminals $\tau$. With the exception of the orientation of tunnel diode D2 the circuits of FIGS. 1 and 2 are identical. The orientation of the tunnel diodes is not material and either circuit is equally effective. Resistor R is connected between the junction of the tunnel diodes D1, D2 and ground, thus forming the $\tau$ circuit configuration of the amplifier. Battery E provides the forward bias for tunnel diodes D1, D2 through current limiting resistors R1 and R2 as shown. Capacitors C1, C2 and C3 provide D.C. isolation for the circuit.

Figures 3, 4:
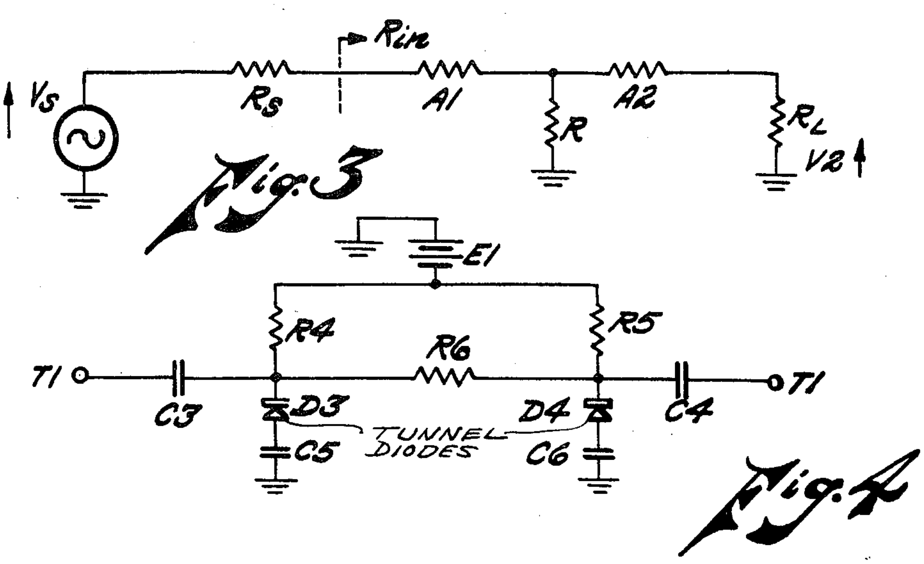
FIG. 3 is an equivalent circuit representing the schematic diagrams of FIGS. 1 and 2.
FIG. 4 is a schematic diagram of the preferred embodiment of the invention employing a $\pi$ circuit configuration.

The relationships between the resistance value of resistor R and the negative resistance values of tunnel diodes D1 and D2 are derived using the equivalent circuit of FIG. 3, reference to which is now made. In these derivations all impedances are normalized with respect to the characteristic impedance of the connected source and load. The connected source and load are assumed to be equal. Having particular reference to FIG. 3, $R_s$ and $R_L$ represent input and output impedances, respectively, and are taken as unity. $V_s$ and $V_2$ represent signals from input-output terminals $\tau$ having direction of travel represented by the adjacent arrows. A1 and A2 represent the negative resistance values of tunnel diodes D1 and D2 respectively and are assumed to be equal.

The voltage gain of the equivalent circuit of FIG. 3, designated M, is defined as $2V_2/V_s$ and will be unity when the source is connected directly to the load. For any values of A (A1 and A2 being equal, A is hereinafter used to designate the value of either) and R therefore $$M=\frac{2R}{(1+A)(1+A+2R)} \qquad (1)$$

The input impedance $R_{in}$ is, therefore, represented by $$R_{in}=A+\frac{R(1+A)}{1+A+R} \qquad (2)$$

For the matched condition $R_{in}=1$ $$A^2+2AR=1 \qquad (3)$$

or $$R=\frac{1-A^2}{2A} \qquad (4)$$

and $$M=\frac{1-A}{1+A} \qquad (5)$$

Accordingly, there will be gain when $|M|>1$. This will be true only if $A<0$. Assuming this, there are two cases to consider: (1) when $|A|<1$, $R<0$; and all resistances are negative and, (2) when $|A|>1$, $R>0$; and only A is negative. In order to minimize the number of diodes required condition (2) is preferred.

By way of notation, the negative of a quantity is designated by a bar; that is, (with A being the negative resistance value of a tunnel diode), $\bar{A}=-A$ and $\bar{M}=-M$. Consequently:

$$\bar{M}=\frac{\bar{A}+1}{\bar{A}-1}=\frac{R}{\sqrt{R^2+1-1}} \qquad (6)$$

$$\bar{A}=\frac{\bar{M}+1}{\bar{M}-1} \qquad (7)$$

and $$R=\frac{A^{-2}-1}{2\bar{A}} \qquad (8)$$

Equation 8 represents the desired relationship between the resistance value of resistor R and the negative resistance values of tunnel diodes D1 and D2.

Referring now to FIG. 4, there is illustrated thereby a schematic diagram of the embodiment of the invention which utilizes the $\pi$ circuit configuration. In this arrangement a resistor R6 is connected between input-output terminals T1. Tunnel diodes D3 and D4 are connected between each end of resistor R6 and ground as shown thus forming a $\pi$ circuit arrangement. As in the $\tau$ circuit configuration tunnel diode biasing means are provided by a battery E1 that is connected to the circuit through current limiting resistance R4 and R5. Also D.C. isolation is provided by means of capacitors C3, C4, C5 and C6.

Figure 5:
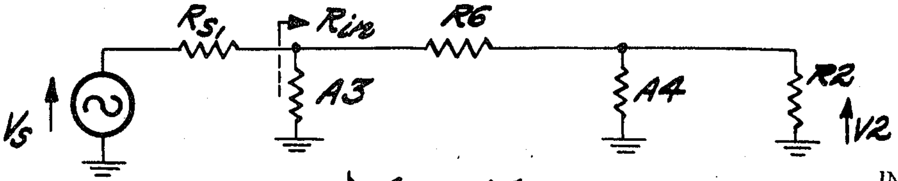
FIG. 5 is an equivalent circuit representing the schematic diagram of FIG. 4.

The equivalent circuit for the embodiment of the invention of FIG. 4 is illustrated by FIG. 5. Notations on the equivalent circuit of FIG. 5 conform to those of the $\tau$ circuit arrangement with A2 and A3 representing the negative resistance values of tunnel diodes D3 and D4 respectively and $RS_1$ and $R_L{}^2$ representing the source and load impedances.

The relationship between tunnel diode resistance values and resistor R6 value can be derived for the $\pi$ circuit arrangement by reference to the parameters of the $\tau$ circuit using the following relationships:

$$A3=A4=A+2R \qquad (9)$$

and;

$$R6=2A+\frac{A^2}{R} \qquad (10)$$

What is claimed is:

1. A bidirectional R.F. amplifier comprising input and output terminals, first and second negative resistance devices, said first and second negative resistance devices being connected in series relationship between said input and output terminals and resistance means, said resistance means being connected between the junction of said first and second negative resistance devices and ground, the relationship of the resistance R of said resistance means to the negative resistance value A of each said negative resistance device being $$R=\frac{A^{-2}-1}{2A}$$

References Cited

UNITED STATES PATENTS 3,217,180 11/1965 Bergman ---------- 330—34 X

OTHER REFERENCES

RCA Tunnel Diode Manual TD-30, RCA Semiconductor & Mat'ls. Division, Somerville, N.J., 1963, p. 54, relied on.

HERMAN KARL SAALBACH, Primary Examiner

P. L. GENSLER, Assistant Examiner

U.S. Cl. X.R.

307—322; 330—34; 333—80